United States Patent [19]
Almogy et al.

[11] Patent Number: 5,661,590
[45] Date of Patent: Aug. 26, 1997

[54] QUANTUM WELL INFRARED PHOTO DETECTOR AND MONOLITHIC CHOPPER

[75] Inventors: Gilad Almogy, Pasadena; Amnon Yariv, San Marino; Yuanjian Xu, Pasadena, all of Calif.

[73] Assignee: California Institute of Technology, Pasadena, Calif.

[21] Appl. No.: 465,274

[22] Filed: Jun. 5, 1995

[51] Int. Cl.$^6$ ................................................. G02F 1/03
[52] U.S. Cl. ........................................... 359/248; 250/332
[58] Field of Search ................................. 359/248, 245, 359/254; 250/332, 350, 351

[56] References Cited

U.S. PATENT DOCUMENTS

| | | | |
|---|---|---|---|
| 3,831,033 | 8/1974 | Hill | 250/578 |
| 4,001,635 | 1/1977 | d'Aruia | 315/169 R |
| 4,637,122 | 1/1987 | Carney | 29/569 L |
| 4,786,918 | 11/1988 | Thornton | 346/108 |
| 4,831,629 | 5/1989 | Paoli | 372/50 |
| 4,860,304 | 8/1989 | Mooradian | 371/92 |
| 4,940,303 | 7/1990 | Abeles | 350/96.11 |
| 4,953,166 | 8/1990 | Mooradian | 372/21 |
| 4,988,153 | 1/1991 | Paek | 350/3.8 |
| 5,007,690 | 4/1991 | Chern | 350/3.68 |
| 5,023,685 | 6/1991 | Bethea et al. | 357/30 |
| 5,115,335 | 5/1992 | Soref | 559/240 |
| 5,115,445 | 5/1992 | Mooradian | 372/75 |
| 5,126,263 | 6/1992 | Cocking | 435/240.47 |
| 5,228,050 | 7/1993 | LaCourse | 372/50 |
| 5,267,255 | 11/1993 | Paoli | 372/50 |
| 5,412,499 | 5/1995 | Chiu et al. | 359/248 |
| 5,485,014 | 1/1996 | Jain et al. | 257/21 |
| 5,519,529 | 5/1996 | Ahearn et al. | 359/248 |

*Primary Examiner*—Georgia Y. Epps
*Assistant Examiner*—Dawn-Marie Bey
*Attorney, Agent, or Firm*—Fish & Richardson, P.C.

[57] ABSTRACT

A quantum well infrared photodetector and modulator are monolithically integrated to one another. The infrared scene impinges on an infrared receiving element such as a phase grating, which couples it to a modulator. The modulator includes asymmetric quantum wells which are shifted by an applied bias. By appropriately adjusting the bias, the modulator can pass a maximum amount of the input information or can pass less. The photodetector and modulator both use the same kinds of materials, preferably GaAs and $Al_xGa_{1-x}As$, so they essentially become a single unit, obtaining better noise and operating characteristics from the combination.

24 Claims, 3 Drawing Sheets

QUANTUM WELL INFRARED PHOTO DETECTOR AND MONOLITHIC CHOPPER

STATEMENT OF GOVERNMENT RIGHTS

The U.S. government has certain rights in this invention pursuant to grant number N00014-91-J-1195 awarded by the Office of Naval Research.

FIELD OF THE INVENTION

The present invention relates to a quantum well infrared photodetector and monolithic chopper which are monolithically integrated to one another. More specifically, the present invention describes a modulator/photodetector which uses similar materials.

BACKGROUND AND SUMMARY OF THE INVENTION

Infrared imaging systems are often fabricated as two dimensional focal plane arrays. Focal plane arrays often form images of slowly-varying schemes. To enhance the viewing of these schemes, longer frame rate integration is desired. "TV frame rates" eg of 40 ms are preferable.

The present inventors have found that temporally modulating or chopping the infrared scene in conjugation with AC coupling of the detector signal obtains TV rate integration, and also reduces $1/f$ noise problems.

Different kinds of infrared photo detectors are known. A GaAs/AlGaAs quantum well photo detector has been used to trap electrons in a low potential energy well—often called a quantum well. However, the quantum well infrared photo detectors previously used have had inherently large and spatially nonuniform dark currents. This leads to saturation of the readout circuits and hence limits the integration times. The spatial nonuniformity of the dark currents also prevents us from using a constant or spatial subtractance scheme. To obviate this problem, the present inventors have recognized that temporal modulating produced the significant advantages of $1/f$ noise reduction and independence of the large dark current nonuniformity.

Simple scanning IR imaging systems with a small number of detectors may be individually addressed by external electronics. Infrared two dimensional focal plane arrays, however, usually have between $10^4$ and $10^6$ elements, each of which receive an IR input to provide an IR signal indicative of a scene. Therefore, individual connections become impractical. The array may therefore be hybridized via Indium bumps to a silicon readout array. The performance of these arrays are still limited, however, by the charge integration capacity of the individual capacitors.

The typical readout circuits can handle roughly $10^7$ electrons for each $10^{-5}$ cm$^2$ pixel. Therefore, there is insufficient charge handling capacity to allow TV rate integration of the total quantum well infrared photo detector current, which is several $10^{-4}$ A/cm$^2 \approx$ on the order of $10^{10}$ electrons/pixel/sec. This is important since it indicates how long it takes pixel to saturate—typically less than 1 ms. This problem thus has tended to minimize the advantage of staring over scanning arrays since it has limited the integration time or limited the bandwidth since integration time is proportional to $1/f$. Hence, this also has reduced the noise-equivalent temperature differences. Large integrated voltages on the readout capacitor have also tended to drive the injection transistor in an unintended way and possibly induce a nonlinear detector response. The integration cannot be done off-chip using today's technology since such external sampling and averaging would require prohibitively fast electronics and hence high cooling requirements.

The inventors have found that modulating or chopping the incident radiation makes it possible to separate the 'ac' type photo-response from the 'dc' type dark current. The dark current is the detector's response to the modulator being off—that is without photon flux of the scheme impinging on the modulator. If the dark current is subtracted from the detector's signal with the modulator on (signal plus dark current) the result represents the net current added to the noise accumulating on the capacitor. This system can allow an IR-modulator along with an electronic circuit to collect the detector's signal current only, and hence can increase the integration time. By increasing the integration time by a factor of N, the signal to noise ratio is increased by a factor of $\sqrt{N}/2$.

Even if the charge integration limitations are somehow removed by reducing the dark current, the temporal modulation reduces the $1/f$ noise by shifting the central bandwidth from near 'dc' to the modulator's frequency.

Mechanical choppers have been used in some currently developed infrared focal plane arrays. However, these require a fast-moving mechanical component with associated power requirements. They also produce associated operating noise and may have limited reliability.

It is one objective of the present invention to develop a fast, reliable electro-optic infra red ("IR") modulator to help realize the full potential of IR-focal plane arrays. This is effected according to the present invention by monolithically integrating materials which form an infrared-focal plane array with a modulator. Preferably, similar materials are used for both.

BRIEF DESCRIPTION OF THE DRAWINGS

These and other aspects of the invention will now be described in detail with reference to the accompanying drawings, wherein.

DESCRIPTION OF THE PREFERRED EMBODIMENTS

Figure 1:
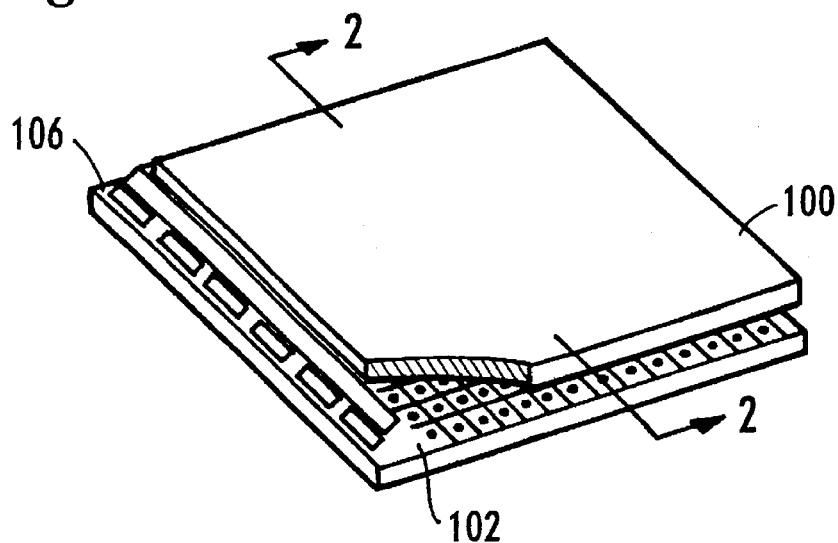
FIG. 1 shows a first embodiment of a infrared focal plane array with a monolithically integrated modulator.

FIG. 1 shows a first embodiment of the present invention. In general, the present invention uses a multi quantum well modulator with a DC electric field applied thereto. The DC electric field changes the absorption spectral response of the vertically integrated modulator array. It hence essentially chops the radiation flux impinging upon that detector array. The modulator of the present invention includes a plurality of elements or a single large element 100 which is the size of the focal plane array 102. A phase grating 200 covers the entire array to allow interaction of the incoming IR radiation with the intersubband transition both in the modulator and in the detector and helps group the input radiation into pixel-shaped elements.

Modulator layer 100 changes the characteristics of the radiation which are impinging on detector layer 102. An indium bump 104 connects the detector layer 102 to the silicon readout electronics 106.

One important advantage of the present invention is that the infrared chopper is formed using the same physical components that form and carry out the infrared detection. Since there is only a fraction of a millimeter of distance between the elements, they function as physically the same part. This produces miniaturization advantages which are not possible according to the prior art.

Figure 3:
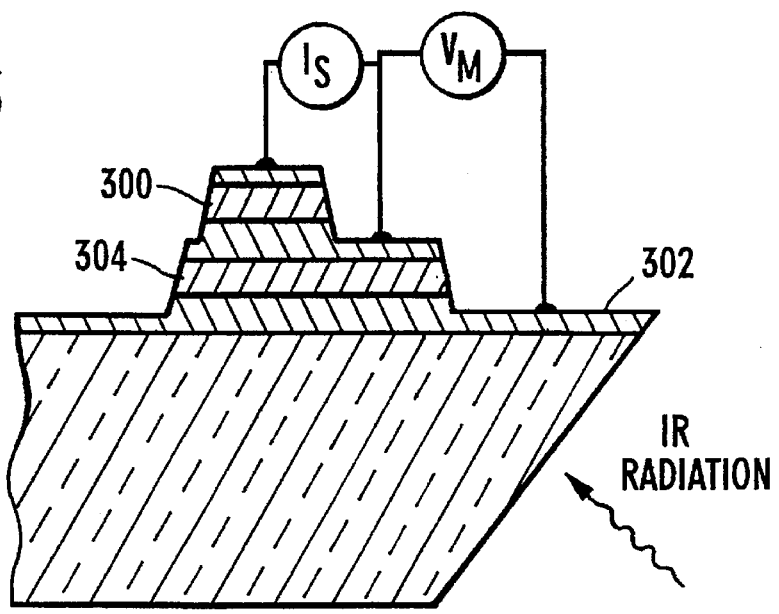
FIG. 3 is a schematic showing a second kind of monolithically integrated detector and modulator shown on the same wafer.
Figure 4:
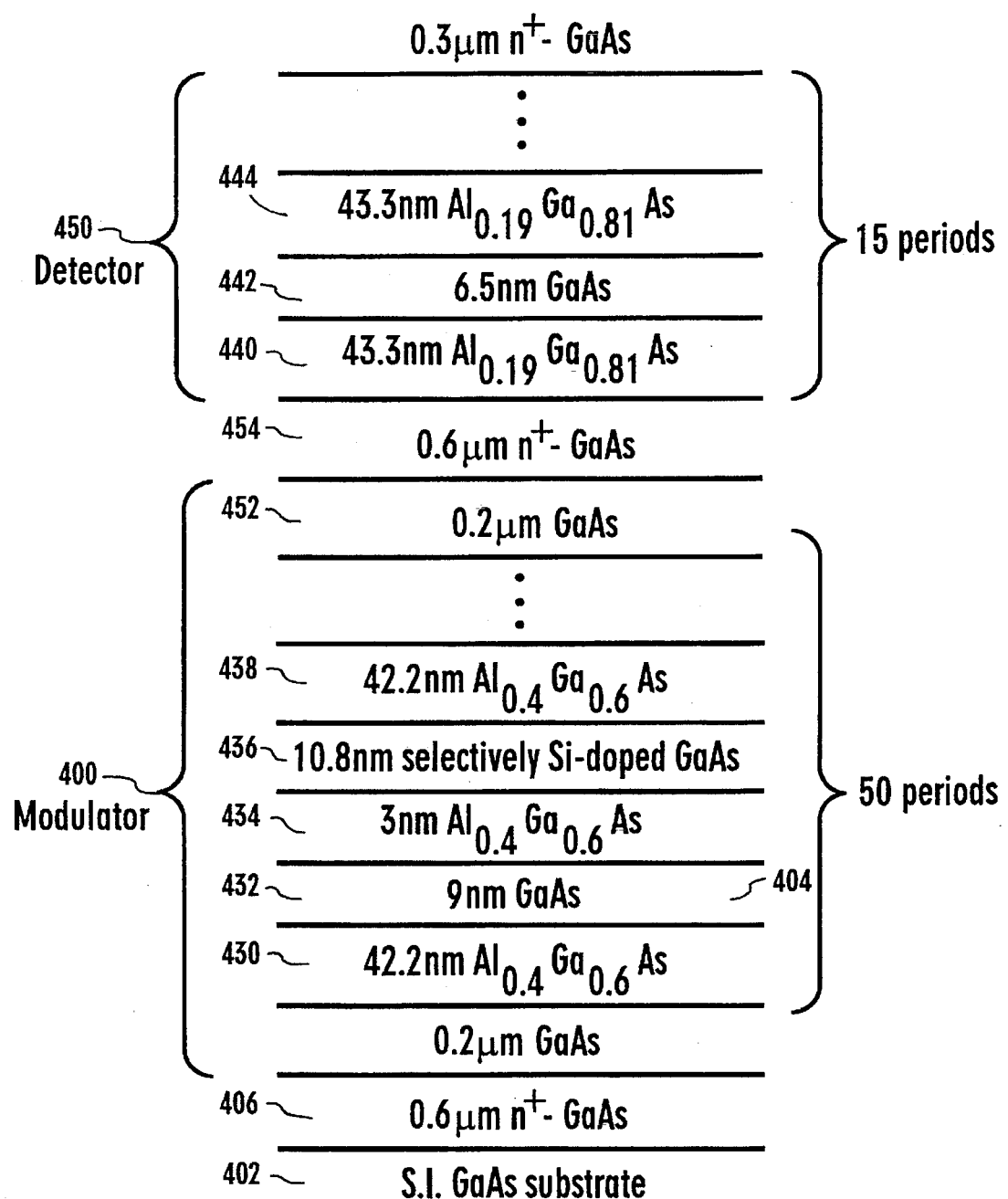
FIG. 4 shows the multiple material layers making up the detector and modulator assembly.

FIG. 3 shows a schematic illustration of a second embodiment, having a single infrared detector with its monolithically integrated modulator, and FIG. 4 shows a cross-section of the multilayers of the integrated semiconductor modulator and detector array shown in FIG. 3. The system operates as follows. The scene flux is modulated on an infrared detector array 300. A 'dc' electric field is used to enhance the modulator's absorption in the detector spectral response range, and to modulate impinging radiation. The 'dc' field is preferably formed by shifting the resonance energy using the 'dc' stark effects in an asymmetric well, controlling or modulating the quantum well population, or by other techniques. Each of these techniques has their own advantages and disadvantages.

Population transfer leads to absorption amplitude control with a minor wavelength shift. The DC stark effect modifies the absorption spectrum and hence has less total effect on the total integrated absorption amplitude and may distort the image. The present inventors prefer lightly coupled quantum wells since they minimally modify the detector's line shape and display robustness at the high doping levels. The applied bias moves the electrons to a narrow well with a resonance frequency to be at the maximum of the detector's photoresponse. This is moved to a wide reservoir quantum well with the transition energy that is at the tail of the detector's photo response spectrum.

FIG. 4 shows the layers making up the modulator and detector array shown in FIG. 3. One importance of the present invention is the inventors' recognition that similar materials can be and preferably are used for both modulator 400 and detector 450. Both the modulator 400 and the detector 450 are formed from combinations of GaAs and $Ga_xAl_{1-x}As$. Other components could also be added and other compositions could be used to produce different quantum well properties. The same materials are used in both the detector and the modulator to form a quantum well between the high and low potential energies which traps electrons.

The inventors found, however, that quantum wells intended for modulation should differ from quantum wells designed for photodetection. In modulation quantum wells, both photo currents and dark currents are undesirable. This means that the subbands should be as confined as possible. The inventors recognized that the quantum well detector should minimize the variation of absorption spectra with applied bias. Modulators, in contrast, should maximize the absorption spectra variation with applied bias and must allow adequate control thereof. This is done according to the present embodiment using a 45° coupling scheme.

Figure 5:
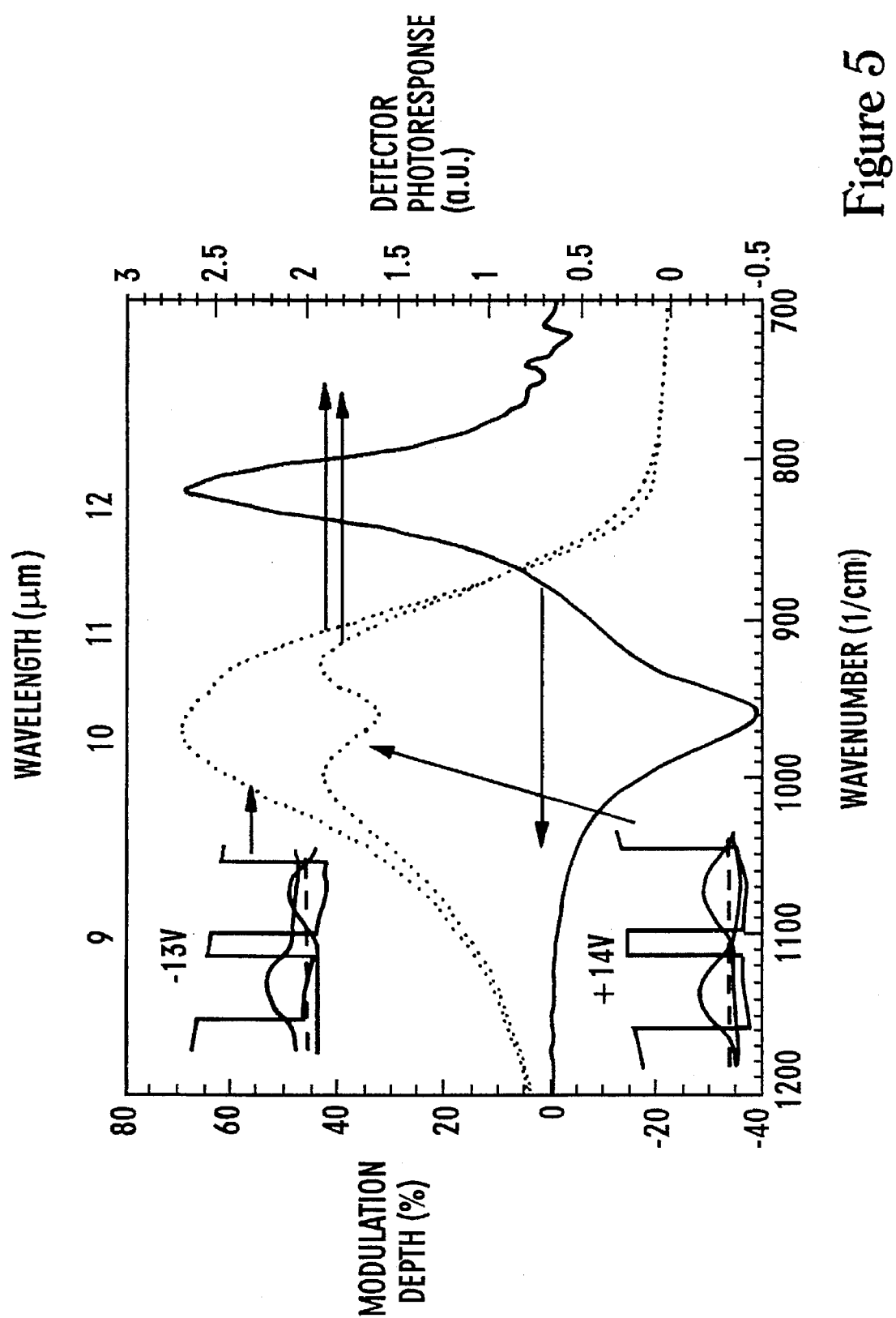
FIG. 5 shows curves illustrating the operation of the present invention.

FIG. 5 shows the responses of the modulator, the detector, and detector plus modulator to absorption. Importantly, the narrow well must have a peak which overlaps with the detector's response range. The wide well's response is outside the region of interest, therefore making it an electron reservoir.

The actual structure used includes a modulator structure 400 formed from a 0.6 micron, $N^+$ doped GaAs substrate 402 or contact layer, and a 0.2 GaAs buffer layer 406, that is covered by a fifty "period" Quantum Well Integrated modulator 404.

The modulator also includes a plurality of sets of layers referred to herein as a "period". Each period corresponds to one of the sets of material shown in the FIG. 4.

Each of the fifty periods of the modulator shown in FIG. 4 includes a 42.2 nm $Al_{0.4}Ga_{0.6}As$ barrier 430, covered by a 9 nm GaAs well 432 which is covered by a 3 nm $Al_{0.4}Ga_{0.6}As$ coupling barrier 434. A second storage well 436 of approximately 10.8 nms, formed of selectively silicon doped GaAs covers coupling barrier 434. The storage well is alternately silicon doped to a nominal volume density of $2 \times 10^{18} cm^{-3}$ in a 4 nm thick region beginning 0.5 nm away from the barrier. A 42.2 nm $Al_{0.4}Ga_{0.6}As$ barrier 438 covers each period.

The 9 nm narrow well 432 is designed to have an absorption spectrum which overlaps the center of the Quantum Well Integrated Photodetector's response.

The double wells are formed and arranged so that the narrow well 432 captures about 20% of its population at zero bias. This will allow use of positive and negative biases, and hence maximize the possible population shift.

The modulator 400 is covered by a 0.2 micron GaAs buffer layer 452, and a 0.6 micron N+GaAs contact layer 454 which separates the modulator from the photodetector. The quantum well infrared photo detector 450 covers the contact layer. Photodetector 450 includes fifteen periods—each period including a 6.5 nm thick silicon doped GaAs quantum wells with nominal doping densities of $1.1 \times 10^{12}$ $cm^{-2}$, surrounded by 43.3 nm $Al_{0.19}Ga_{0.81}As$ barriers.

Figure 2:
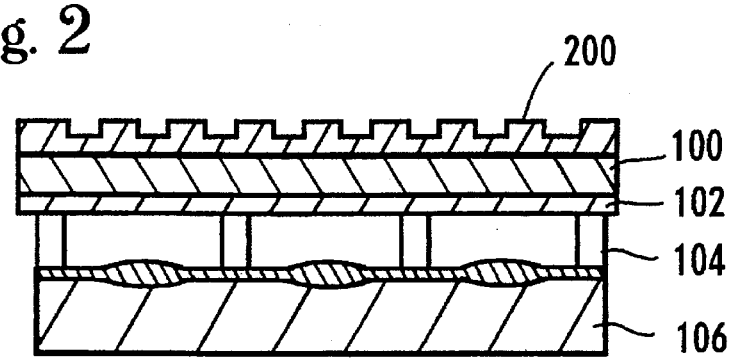
FIG. 2 shows a cross section of this array along the line 2—2 in FIG. 1.

The overall system is formed using two etching steps. Mesas of about 400×300 nm are formed by these etching steps. In the FIG. 3, a cleaved facet is later lapped to a 45° angle allowing light to first pass through the multi quantum well modulator before reaching the quantum well infrared photo detector. Any standard light coupling mechanism can be used according to the present invention. The first embodiment shown in FIGS. 1 and 2 uses a phase grating, while the second embodiment shown in FIG. 3 uses a lapped facet.

The second embodiment uses mesas fabricated in a two step etching process, having an edge of the sample which is polished to 45° in order to couple the infrared radiation according to the intersubband selection rules. FIG. 4 shows the barriers 440, covered by quantum wells 442, and additional barriers 444. A final layer 446 overlies the device.

FIG. 5 shows the self consistent stimulation of the modulator's response under different applied biases, including the modulation of the detector's response at the modulator's absorption peak.

The operation is explained with reference to FIG. 5. FIG. 5 shows the detector's photoresponse at different levels of bias on the modulator. When the modulator is biased at −13 volts, the modulator operates as shown in the small diagram in the upper left of FIG. 5. The narrow well in the modulator is almost completely depleted. Because of this difference in potential, virtually all electrons will be caught by the lower well. This leaves the photodetector 450 with an undisturbed response as shown by the upper curve in FIG. 5.

In contrast, when the modulator is biased to +14 volts, the narrow well displays maximum absorption. This means that both wells, not just the one, will receive electrons. In this situation, the photo detector's overall response is as shown in the lower curve in FIG. 5.

The difference between the undisturbed case and the disturbed case contributes to the response difference between the modulated and unmodulated systems.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. An infrared detection system that converts incident infrared radiation indicative of a scene to be imaged into electrical signals comprising:

an infrared energy coupling mechanism, formed in a location to receive said incident infrared radiation;

a plurality of modulator layers including first and second materials, formed optically close to said incident infrared energy coupling mechanism, to form a temporal infrared modulator having first and second quantum wells, at least one of which reacts to said incident infrared radiation via intersubband transitions by an amount dependent on an applied bias to effect temporal modulation between a first bias at a first time that allows a first amount of said incident infrared radiation to pass, and a second bias at a second time that allows a second amount of said infrared radiation to pass, said first amount greater than said second amount;

a second plurality of detector layers also including said first and second materials, monolithically integrated with said modulator layers in a location such that said modulator layers are between said infrared energy coupling layers and said detector layers, to form an infrared detector which is monolithically integrated with said temporal infrared modulator layers; and a controlling element, temporally controlling said bias applied to said modulator layers to varying amounts including said first and second amounts, and thereby chopping said incident infrared radiation to produce a temporally alternating electrical signal.

2. A system as in claim 1 wherein said materials include GaAs and $Al_xGa_{1-x}As$.

3. A system as in claim 1 wherein said infrared energy coupling mechanism is a phase grating.

4. A system as in claim 1 further comprising a substrate, said substrate including an angled face forming said infrared energy coupling mechanism.

5. A system as in claim 1 further comprising a biasing system, biasing said modulator layers, a first amount of bias forming more absorptive quantum energy wells, and a second amount of bias causing less absorptive quantive energy wells.

6. A system as in claim 5 wherein said modulator layers are formed to maximize absorption amplitude and minimize absorption spectra variation with applied bias.

7. A system as in claim 6 wherein said modulator includes a plurality of barrier layers, a plurality of well layers, and a plurality of coupling barriers.

8. A system as in claim 5 wherein said modulator includes a first narrow well which is depleted by negative bias and populated by positive bias, and a second wider well, wider than said first well, whose absorption does not block a significant portion of radiation in the detector's spectral response range.

9. A system as in claim 1, further comprising:

an electronic unit operating to separate an unmodulated DC electrical background signal caused by a dark electrical current present in said detector layers from a total electrical signal detected thereby based on an operation of said temporal infrared modulator layers, to thereby produce an output electrical signal with a reduced contribution from non-radiation induced components present in said infrared detector.

10. A system as in claim 1, further comprising:

an electronic unit operating to AC couple said detector layers to reduce noise with a frequency characteristic proportional to 1/f, based on said temporal modulation of said incident infrared radiation by said modulator layers.

11. An infrared modulator system for converting an incident infrared radiation indicative of a scene to be imaged into a temporally alternating electrical signal, comprising a first element with multiple quantum wells, a controlling element and a biasing element, said first element arranged to have multiple quantum wells of an asymmetric type, said controlling element periodically modulating said bias in the time domain and thereby changing absorption of said multiple quantum wells according to said modulating to chop said infrared radiation by altering said absorption of said multiple quantum wells and thereby forming chopped images indicative of said scene to be imaged at discrete and separated times.

12. A system as in claim 11 further comprising a plurality of detector layers, monolithically integrated with said first element such that said first element is between said detector layers and a source of infrared radiation, and to form a modulator/detector array.

13. An infrared detection system for converting an incident infrared radiation indicative of a scene to be imaged into electrical signals, comprising:

an infrared energy coupling mechanism, formed to receive infrared energy;

a first plurality of modulator layers, said first plurality of modulator layers including elements for periodically modulating an amount of said incident infrared radiation passing therethrough in the time domain, and having an arrangement to maximize an absorption spectrum variation of intersubband transitions based on a first applied bias;

a first biasing element, selectively biasing said modulator layers via controlling said first applied bias in a first way to maximize said incident infrared radiation passing therethrough, and in a second way to minimize said incident infrared radiation passing therethrough to chop said incident infrared radiation;

a controlling element, periodically modulating said first bias applied to said modulator layers in the time domain and thereby chopping said incident infrared radiation by temporally altering said incident infrared radiation pass therethrough to form chopped images indicative of said scene to be imaged at discrete times; and a plurality of layers forming an infrared detector, said plurality of layers minimizing variation of absorption spectra with a second applied bias and receiving said chopped infrared radiation from said modulator layers.

14. A system as in claim 13 wherein said modulator layers and said detector layers are formed using common materials.

15. A system as in claim 14 wherein said common materials include GaAs and $Al_xGa_{1-x}As$.

16. A system as in claim 14 wherein said infrared energy coupling mechanism includes a phase grating.

17. A system as in 13, further comprising:

an electronic unit operating to separate an unmodulated DC electrical background signal caused by a dark electrical current present in said infrared detector from a total electrical signal detected thereby based on an operation of said modulator layers, to thereby produce an output electrical signal with a reduced contribution from non-radiation induced components present in said infrared detector.

18. A system as in claim 13, further comprising:

an electronic unit operating to AC couple said detector to reduce noise with a frequency characteristic proportional to 1/f, based on said temporal modulation of said incident infrared radiation by said modulator layers.

19. A method of temporally modulating an infrared scene, while maintaining relative spatial radiation intensity distribution thereof unchanged, comprising:

providing an infrared modulator mechanism which includes more than one quantum well, each of which captures electromagnetic radiation-produced particles dependent on an applied bias;

applying said bias in a first way to shift the quantum wells in a first asymmetric way to cause the quantum wells each to receive the particles by a first amount and to cause a first amount of energy modulation;

applying said bias in a second way to shift the asymmetric quantum wells to a different relationship which causes them to receive the particles by a different amount than the first amount;

repetitively changing said bias between said first way and said second way in sequence to generate a periodically alternating change in said bias in the time domain, and thereby obtaining a temporally alternating energy modulation on said infrared scene between said first amount and said second amount; and converting said temporally alternating infrared scene into a temporally alternating signal by a plurality of integrated quantum-well detector layers.

20. A method of detecting an infrared image, comprising:

coupling incident radiation from an infrared scene with a spatial radiation modulating element to a temporal radiation modulator that is monolithic integrated to a radiation detector, said temporal radiation modulator and radiation detector having different multiple-quantum-well structures with intersubband transitions;

applying a first bias to said multiple-quantum-well radiation modulator to alter radiation absorbing characteristics thereof;

periodically modulating said incident radiation in the time domain with said multiple-quantum-well radiation modulator by changing said first bias;

applying a second bias to said radiation detector;

separating & background electrical signal caused by a dark electrical current from a detected electrical signal by said radiation detector to produce an output electrical signal with reduced contribution from non-radiation induced components in said radiation detector, thereby to achieve full TV frame rate integration and to prevents saturation of readout circuits;

AC coupling said radiation detector at a frequency substantially identical to said modulating frequency of said radiation modulator to reduce noise with a frequency characteristic proportional to 1/f.

21. A method as in claim 20 wherein said radiation modulator is made of a first multiple-quantum-well structure having confined intersubbands and said first bias applied thereto is set to maximize absorption spectra variation; said radiation detector is made of a second multiple-quantum-well-structure having said second bias applied thereto set to minimize absorption spectra variation.

22. A method as in claim 20 wherein said radiation modulator and said radiation detector are made of substantially identical material compositions including GaAs and $Al_xGa_{1-x}As$.

23. A method as in claim 20 wherein said spatial radiation modulating element is a phase grating.

24. A method as in claim 20 wherein said spatial radiation modulating element comprises a substrate including an angled facet.

* * * * *